(12) United States Patent
Chang et al.

(10) Patent No.: US 8,724,323 B2
(45) Date of Patent: May 13, 2014

(54) ELECTRONIC DEVICE WITH HEAT DISSIPATION APPARATUS

(75) Inventors: Yao-Ting Chang, New Taipei (TW); Hung-Chou Chan, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 216 days.

(21) Appl. No.: 13/337,260

(22) Filed: Dec. 26, 2011

(65) Prior Publication Data

US 2013/0155622 A1    Jun. 20, 2013

(30) Foreign Application Priority Data

Dec. 16, 2011  (TW) .............................. 100146971 A

(51) Int. Cl.
*H05K 7/20* (2006.01)

(52) U.S. Cl.
USPC ...... 361/700; 361/679.47; 361/697; 361/707; 361/710

(58) Field of Classification Search
USPC .......... 361/679.47, 679.52, 679.54, 697, 700, 361/707, 709–711, 714
See application file for complete search history.

(56) References Cited

U.S. PATENT DOCUMENTS

| | | | | |
|---|---|---|---|---|
| 5,781,409 A | * | 7/1998 | Mecredy, III | 361/679.27 |
| 6,011,689 A | * | 1/2000 | Wrycraft | 361/695 |
| 6,172,871 B1 | * | 1/2001 | Holung et al. | 361/679.47 |
| 6,175,493 B1 | * | 1/2001 | Gold | 361/679.47 |
| 6,650,536 B2 | * | 11/2003 | Lee et al. | 361/679.47 |
| 7,013,960 B2 | * | 3/2006 | Lee et al. | 165/104.33 |
| 2003/0102108 A1 | * | 6/2003 | Sarraf et al. | 165/80.3 |
| 2008/0212285 A1 | * | 9/2008 | Sun | 361/710 |

* cited by examiner

*Primary Examiner* — Anatholy Vortman
*Assistant Examiner* — Jacob Crum
(74) *Attorney, Agent, or Firm* — Novak Druce Connolly Bove + Quigg LLP

(57) ABSTRACT

A heat dissipation apparatus for an electronic component mounted in a casing of an electronic device includes a first heat sink attached to the component, a second heat sink located outside the casing, and a heat pipe connected between the first heat sink and the second heat sink. The heat pipe contacts the casing.

4 Claims, 3 Drawing Sheets

US 8,724,323 B2

ELECTRONIC DEVICE WITH HEAT DISSIPATION APPARATUS

BACKGROUND

1. Technical Field

The present disclosure relates to electronic devices, and particularly to an electronic device with a heat dissipation apparatus.

2. Description of Related Art

With the development of electronic technology, an electronic device, such as a computer or a server is devised to be much thinner and smaller, yet still holds more electronic components, such as central processing units (CPUs), memory cards, and south bridge chips. The CPUs generate a large amount of heat during operation. The heat needs to be dissipated immediately to ensure the continued proper function of the electronic devices. Presently, a heat sink is mounted on a CPU for dissipating the heat, and a cooling fan is installed to the heat sink for generating airflow. However, the cooling fan occupies much space, and wastes energy.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The present disclosure, including the accompanying drawings, is illustrated by way of examples and not by way of limitation. It should be noted that references to "an" or "one" embodiment in this disclosure are not necessarily to the same embodiment, and such references mean at least one.

Figure 1:
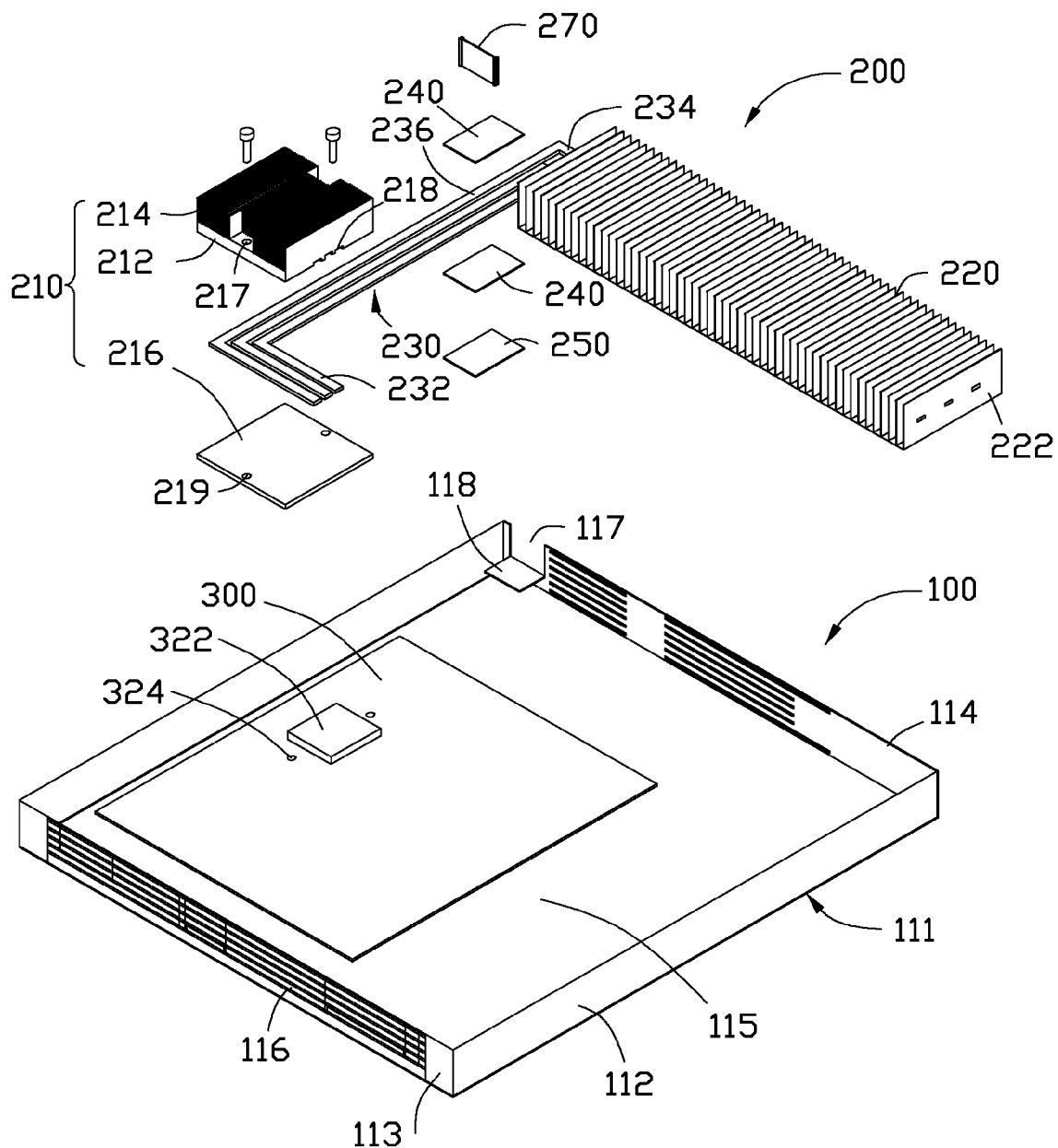
FIG. 1 is an exploded, isometric view of an exemplary embodiment of an electronic device, wherein the electronic device includes a latching member.

Referring to FIG. 1, an exemplary embodiment of an electronic device includes a metal casing 100, a heat dissipation apparatus 200, and a motherboard 300.

The casing 100 includes a bottom wall 111, two sidewalls 112 extending up from two opposite sides of the bottom wall 111, a first end wall 113 extending up from a first end of the bottom wall 111, and a second end wall 114 extending up from a second end of the bottom wall 111 opposite to the first end wall 113. The bottom wall 111, the sidewalls 112, and the first and second end walls 113 and 114 cooperatively bound a receiving space 115. The first and second end walls 113 and 114 each define a plurality of vents 116. The second end wall 114 defines a cutout 117 adjacent to one of the sidewall 112. A supporting piece 118 perpendicularly extends into the receiving space 115 from the second end wall 114 adjacent to a bottom end of the cutout 117.

The motherboard 300 is mounted on the bottom wall 111. An electronic component 322 is mounted on the motherboard 300. The motherboard 300 defines two fastening holes 324 therein, at opposite sides of the electronic component 322.

The heat dissipation apparatus 200 includes a first heat sink 210, a second heat sink 220, a plurality of heat pipes 230 connected between the first heat sink 210 and the second heat sink 220, two heat dissipation pieces 240, a heat-conducting piece 250, and a latching member 270.

The first heat sink 210 includes a base 212, a plurality of first fins 214 extending up from the base 212, and a heat-conducting piece 216. The base 212 defines a plurality of slots 218 in a bottom of the base 212 opposite to the first fins 214, and two fixing holes 217 in two opposite sides of the base 212. The heat-conducting piece 216 defines two through holes 219.

The second heat sink 220 includes a plurality of second fins 222.

Each heat pipe 230 includes a first installing portion 232, a second installing portion 234 parallel to the first installing portion 232, and a connecting portion 236 perpendicularly connected between the first installing portion 232 and the second installing portion 234. The second installing portions 234 of the heat pipes 230 perpendicularly extend through the second fins 222 to fix the second heat sink 220.

Figure 2:
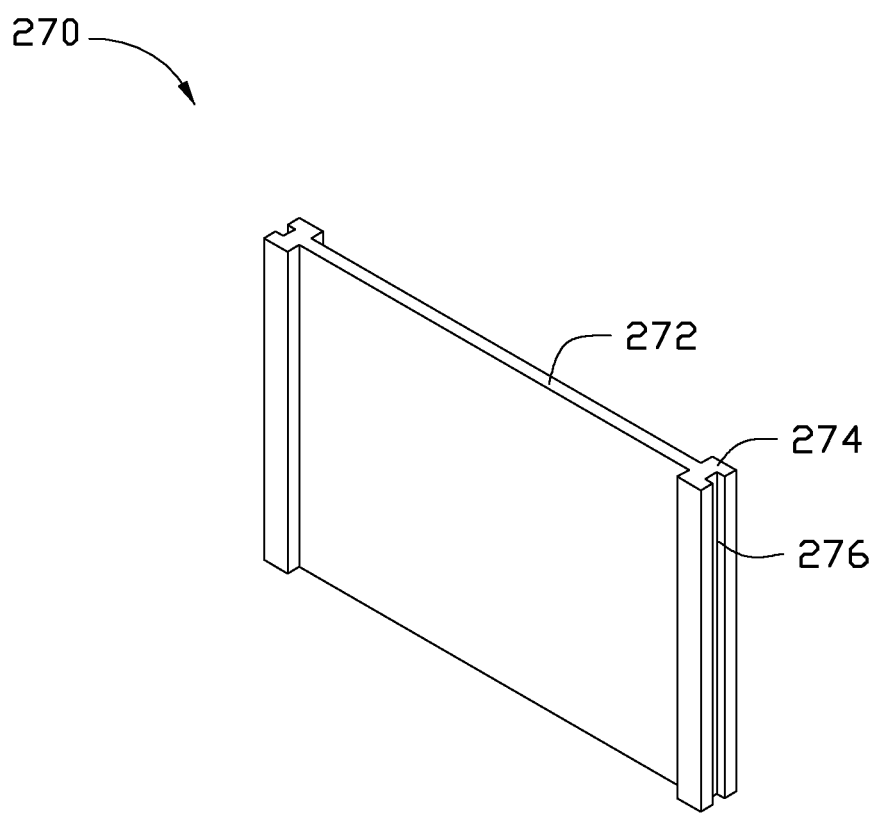
FIG. 2 is an enlarged, isometric view of the latching member of FIG. 1.

Referring to FIG. 2, the latching member 270 includes an abutting piece 272 and two bars 274 extending out from two opposite ends of the abutting piece 272. A side surface of each bar 274 opposite to the abutting piece 272 defines a latching slot 276 extending along a lengthwise direction of the bar 274.

Figure 3:
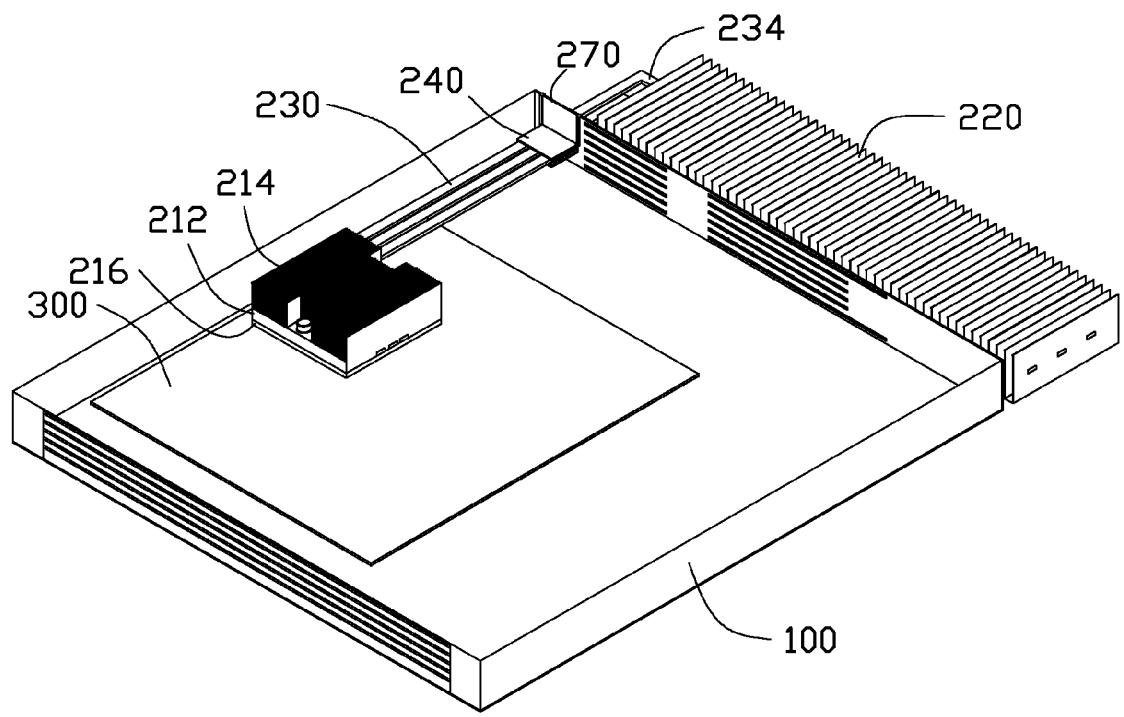
FIG. 3 is an assembled, isometric view of FIG. 1.

Referring to FIG. 3, in assembly, the heat-conducting piece 250 is supported on the supporting piece 118. One of the heat dissipation pieces 240 is supported on the heat-conducting piece 250. The first installing portions 232 are received in the corresponding slots 218 by soldering. Two screws extend through the fixing holes 217 and the through holes 219 to be screwed into the corresponding fastening holes 324. The connecting portions 236 are supported on the supporting piece 118. The second heat sink 220 is located outside the receiving space 115 and adjacent to the second end wall 114. The other heat dissipation piece 240 is supported on the connecting portions 236 opposite to the supporting piece 118. The latching member 270 is placed above the second end wall 114, with the latching slots 276 respectively aligning with two sidewalls bounding the cutout 117. The latching member 270 is moved down. The latching slots 276 slidably receive the corresponding sidewalls bounding the cutout 117. Therefore, the abutting piece 272 covers the cutouts 117, and a bottom side of the abutting piece 272 abuts against the heat dissipation piece 240.

In use, a first part of heat generated by the electronic component 322 is transferred to the first heat sink 210 through the heat-conducting piece 216. A second part of the heat is transferred to the casing 100 through the heat pipe 230, the heat dissipation 240, the heat-conducting piece 250, and the supporting piece 118 in that order. A third part of the heat is transferred to the second heat sink 220 through the heat pipe 230. Therefore, a large dissipating surface is formed by the first heat sink 210, the casing 100, and the second heat sink 220, thus the heat can be removed efficiently and timely because of the large dissipating surface.

While the disclosure describes examples and embodiments, it is to be understood that the disclosure is not limited thereto. To the contrary, the disclosure is intended to cover various modifications and similar arrangements as would be apparent to those skilled in the art. Therefore, the scope of the appended claims should be accorded the broadest interpretation so as to encompass all such modifications and similar arrangements.

What is claimed is:

1. An electronic device comprising:
    a metal casing;
    a motherboard mounted in the casing and comprising an electronic component; and
    a heat dissipation apparatus comprising a first heat sink thermally attached to the electronic component, a second heat sink located outside the metal casing, and a heat pipe thermally connected between the first heat sink and the second heat sink, wherein the heat pipe thermally contacts the casing; wherein the metal casing comprises a bottom wall supporting the motherboard, a first end wall extending up from a first end of the bottom wall, and a second end wall extending up from a second end of the bottom wall opposite to the first end wall, the second end wall defines a cutout through which the heat pipe extends;

wherein a supporting piece perpendicularly extends in from the second end wall adjacent to a bottom end of the cutout, the heat dissipation apparatus further comprises a heat-conducting piece supported on the supporting piece, and a heat dissipation piece supported on the heat-conducting piece, the heat pipe is supported on the heat dissipation piece.

2. The electronic device of claim 1, wherein the first and second end walls each define a plurality of vents, the second heat sink is located at an outer side of the second end wall.

3. The electronic device of claim 1, wherein the heat pipe comprises a first installing portion mounted to the first heat sink, a second installing portion mounted to the second heat sink, and a connecting portion connected between the first heat sink and the second heat sink.

4. The electronic device of claim 3, wherein the heat dissipation apparatus further comprises a latching member slidably latched in the cutout, a bottom of the latching member abuts against the connecting portion.

\* \* \* \* \*